United States Patent
Ha (10) Patent No.: US 8,703,622 B2
(45) Date of Patent: Apr. 22, 2014

(54) FLAT PANEL DISPLAY DEVICE AND METHOD OF MANUFACTURING THE SAME

(75) Inventor: Kuen-Dong Ha, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 292 days.

(21) Appl. No.: 13/330,907

(22) Filed: Dec. 20, 2011

(65) Prior Publication Data

US 2012/0181929 A1 Jul. 19, 2012

(30) Foreign Application Priority Data

Jan. 18, 2011 (KR) .......................... 10-2011-0004985

(51) Int. Cl.
*H01L 21/31* (2006.01)
*H01L 21/469* (2006.01)

(52) U.S. Cl.
USPC .......................................... 438/758; 438/761

(58) Field of Classification Search
USPC ........ 348/26, 28, 29, 479, 758, 761, 762, 763
See application file for complete search history.

(56) References Cited

U.S. PATENT DOCUMENTS

| | | | |
|---|---|---|---|
| 2008/0238302 A1* | 10/2008 | Sung et al. | ..................... 313/504 |
| 2009/0064717 A1 | 3/2009 | Son et al. | |
| 2009/0068917 A1* | 3/2009 | Kim | ............................... 445/25 |

FOREIGN PATENT DOCUMENTS

| | | | |
|---|---|---|---|
| JP | 2003-272830 A | | 9/2003 |
| KR | 10-2002-0089896 A | | 11/2002 |
| KR | 10-2007-0085333 A | | 8/2007 |
| KR | 10-2008-0088031 A | | 10/2008 |
| KR | 10-2009-0026421 A | | 3/2009 |
| KR | 10-2009-0027432 A | | 3/2009 |
| WO | WO 03/005773 A1 | | 1/2003 |
| WO | WO 2006/045067 A1 | | 4/2006 |

* cited by examiner

*Primary Examiner* — Minh D A
(74) *Attorney, Agent, or Firm* — Lee & Morse, P.C.

(57) ABSTRACT

A flat panel display device includes a substrate having a display unit, a metal sealing substrate including a first metal layer, a second metal layer, and an insulating layer therebetween, a sealing member between the substrate and the metal sealing substrate, and a power supply device including a magnet, the power supply being positioned on the metal sealing substrate and further including a first power supply unit configured to supply a first power to the first metal layer of the metal sealing substrate, a second power supply unit configured to supply a second power to the second metal layer of the metal sealing substrate, and an insulating unit between the first power supply unit and the second power supply unit, the insulating unit being configured to insulate the first and second power supply units from each other.

20 Claims, 8 Drawing Sheets

FLAT PANEL DISPLAY DEVICE AND METHOD OF MANUFACTURING THE SAME

BACKGROUND

1. Field

Example embodiments relate to a flat panel display device and a method of manufacturing the same, and more particularly, to a flat panel display device that includes a metal sealing substrate and a method of manufacturing the same.

2. Description of the Related Art

As flat panel display devices, e.g., organic light emitting display devices, may be manufactured to be thin and flexible, many studies have been conducted in relation to such devices. However, as flat panel display devices, e.g., organic light emitting display devices, may be degraded by moisture that penetrates into a display unit, a sealing structure that protects the display unit from moisture penetration may be needed.

SUMMARY

According to an aspect of an example embodiment, there is provided a flat panel display device including a substrate having a display unit on a surface thereof, a metal sealing substrate on the substrate, the metal sealing substrate including a first metal layer, a second metal layer, and an insulating layer interposed between the first and second metal layers, the first metal layer, the insulating layer, and the second metal layer being sequentially stacked on the substrate, a sealing member between the substrate and the metal sealing substrate, the sealing member being configured to attach the substrate to the metal sealing substrate, and a power supply device including a magnet, the power supply being positioned on the metal sealing substrate and further including a first power supply unit configured to supply a first power to the first metal layer of the metal sealing substrate, a second power supply unit configured to supply a second power to the second metal layer of the metal sealing substrate, and an insulating unit between the first power supply unit and the second power supply unit, the insulating unit being configured to insulate the first and second power supply units from each other.

Each of the first and second metal layers may include at least one of Al, Fe, Cu, Mo, Ag, W, and Ti.

The insulating layer may include at least of polyimide, polyester, acryl, silicon oxide, silicon nitride, and siliconoxynitride.

The sealing member may include at least one of an epoxy group adhesive, a silicon group adhesive, and an acryl group adhesive.

The metal sealing substrate may further include a first adhesive layer between the first metal layer and the insulating layer, and a second adhesive layer between the second metal layer and the insulating layer.

The first and second adhesive layers may include a same material as the sealing member.

The metal sealing substrate may have an area greater than that of the substrate.

The metal sealing substrate may include a first portion covering a surface of the substrate, and a second portion continuous with the first portion and extending beyond the substrate, the second portion being folded to overlap the first portion at a boundary between the first and second portions.

The second portion may be folded to the first portion in a direction opposite to the substrate.

The insulating layer may protrude beyond the second portion in a direction extending from the first portion toward the second portion.

The first power supply unit may include a first fixing unit on the first portion of the metal sealing substrate, the first fixing unit including the magnet, and a first connection unit on the first fixing unit and directly contacting the first portion, the first connection unit being configured to supply the first power to the first metal layer.

The first fixing unit may further include a first adhesive unit on a lower surface of the first fixing unit that contacts the first portion.

The first adhesive unit may include a double-sided tape.

The second power supply unit may include a second fixing unit on the second portion of the metal sealing substrate, the second fixing unit including the magnet, and a second connection unit on the second fixing unit and directly contacting the second portion, the second connection unit being configured to supply the second power to the second metal layer.

The second fixing unit may further include a second adhesive unit on a lower surface of the second fixing unit that contacts the second portion.

The second adhesive unit may include a double-sided tape.

According to another aspect of an example embodiment, there is provided a method of manufacturing a flat panel display device, the method including forming a substrate having a display unit on a surface thereof, forming a metal sealing substrate on a substrate to seal a display unit, the metal sealing substrate including a first metal layer, a second metal layer, and an insulating layer interposed between the first and second metal layers, the first metal layer, the insulating layer, and the second metal layer being sequentially stacked on the substrate, forming a sealing member between the substrate and the metal sealing substrate, the sealing member being configured to attach the substrate to the metal sealing substrate, and forming a power supply device including a magnet, the power supply being positioned on the metal sealing substrate and further including a first power supply unit configured to supply a first power to the first metal layer of the metal sealing substrate, a second power supply unit configured to supply a second power to the second metal layer of the metal sealing substrate, and an insulating unit between the first power supply unit and the second power supply unit, the insulating unit being configured to insulate the first and second power supply units from each other.

Forming the metal sealing substrate may include defining a first portion and a second portion, such that the first portion of the metal sealing substrate covers a surface of the substrate and the second portion of the metal sealing substrate protrudes beyond the substrate, and folding the second portion of the metal sealing substrate to overlap the first portion at a boundary between the first and second portions, and wherein forming the power supply device includes affixing the power supply to the metal sealing substrate via a magnetic force.

Folding the metal sealing substrate may include folding the second portion in a direction opposite to the substrate.

Forming the power supply device may include disposing the first power supply unit on the folded second portion and disposing the second power supply unit in the first portion.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2011-0004985, filed on Jan. 18, 2011, in the Korean Intellectual Property Office, and entitled: "Flat Panel Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
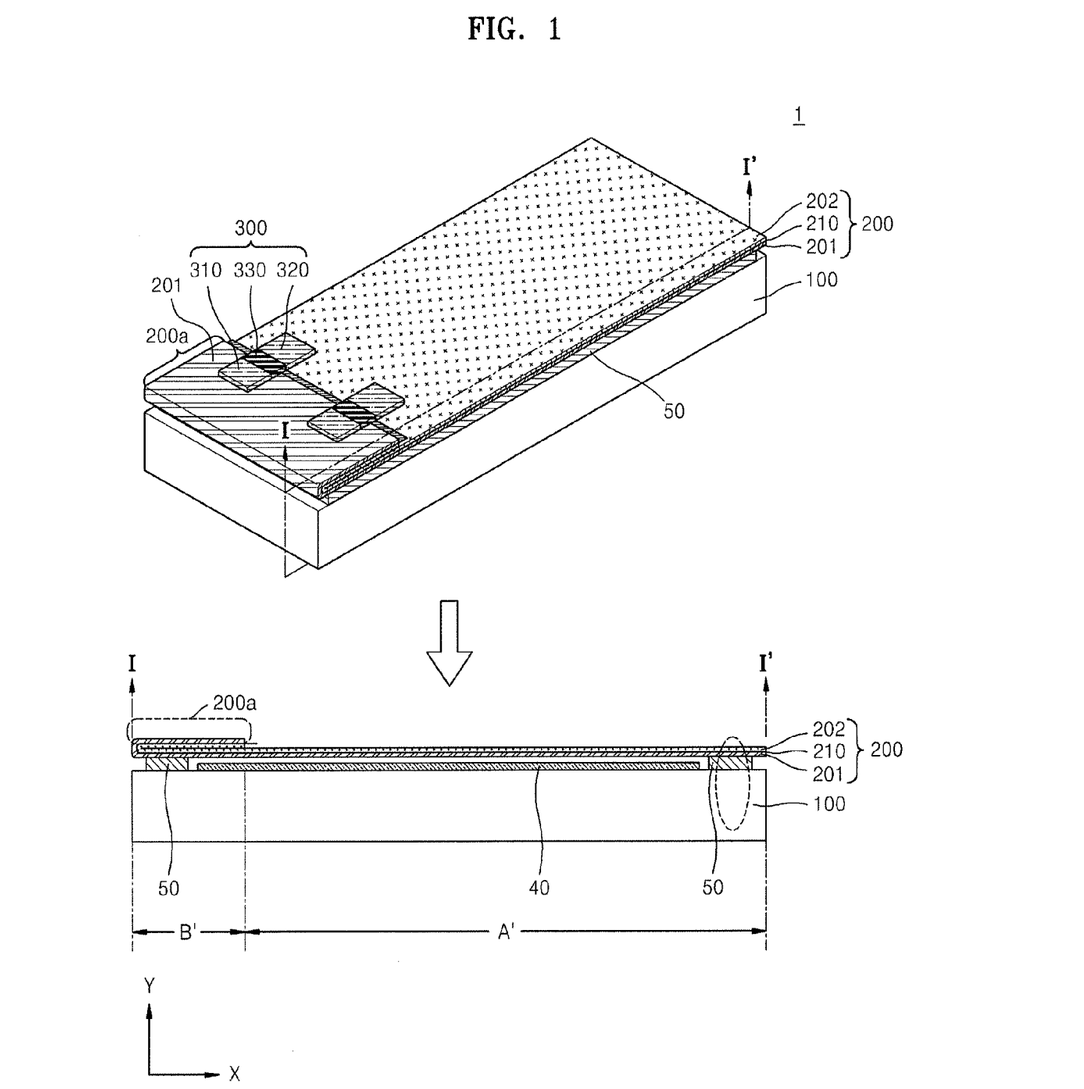
FIG. 1 illustrates a schematic perspective view and a cross-sectional view of a flat panel display device having a power supply device according to an embodiment.
Figure 2:
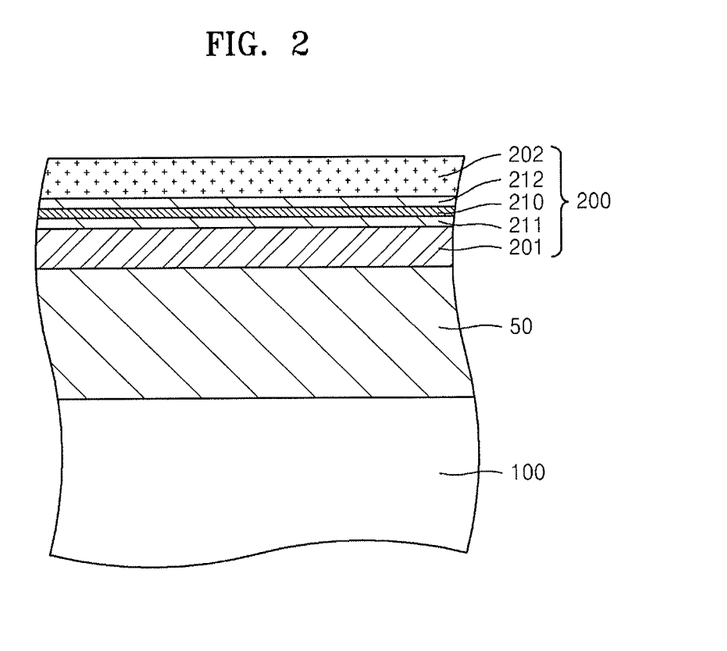
FIG. 2 illustrates a magnified cross-sectional view of part A of the flat panel display device of FIG. 1.
Figure 3:
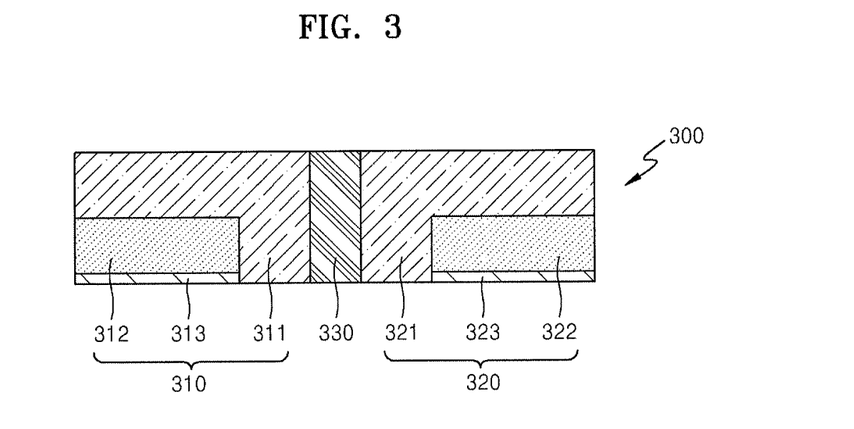
FIG. 3 illustrates a magnified cross-sectional view of the power supply device of FIG. 1.

FIG. 1 illustrates a perspective view and a cross-sectional view of a flat panel display device 1 having a power supply device 300 according to an embodiment. The cross-sectional view is taken along line I-I'. FIG. 2 illustrates a magnified cross-sectional view of part A in FIG. 1, and FIG. 3 illustrates a magnified cross-sectional view of the power supply device 300.

Referring to FIG. 1, the flat panel display device 1 may include a substrate 100, a sealing substrate 200, a sealing member 50 between the substrate 100 and the sealing substrate 200, and the power supply device 300 disposed on the sealing substrate 200. The substrate 100 may be a transparent glass material substrate, e.g., containing $SiO_2$ as a main component, but is not limited thereto.

The flat panel display device 1 may further include a display unit 40 on a surface of the substrate 100 for displaying an image. The display unit 40 may include various display devices that can display images. For example, the display unit 40 may include an organic light emitting diode (OLED) device, an inorganic light emitting device, a liquid crystal device, or an electrophoretic device.

The sealing substrate 200 may seal the display unit 40 on a surface of the substrate 100, so the display unit 40 may be enclosed between the substrate 100 and the sealing substrate 200. The sealing substrate 200 may have a substrate shape as shown in FIG. 1 or a sheet shape, e.g., a substantially flat shape.

The sealing substrate 200 may be formed of metal. It is noted that hereinafter the terms "sealing substrate 200" and "metal sealing substrate 200" may be used interchangeably.

As illustrated in FIGS. 1 and 2, the sealing substrate 200 may include a first metal layer 201, a second metal layer 202, and an insulating layer 210 interposed between the first and second metal layers 201 and 202. As parts of the sealing substrate 200, the first and second metal layers 201 and 202 may transmit power from the power supply device 300 to the display unit 40 and may seal the display unit 40.

A first power transmitted from the power supply device 300 may be supplied to the first metal layer 201, and a second power transmitted from the power supply device 300 may be supplied to the second metal layer 202. Although not shown, the first metal layer 201 may be electrically coupled to the display unit 40, thereby transmitting the first power transmitted from the power supply device 300 to an electrical device, e.g., electrode, included in the display unit 40. Also, the second metal layer 202 may be electrically coupled to the display unit 40, thereby transmitting the second power transmitted from the power supply device 300 to an electrode included in the display unit 40. For example, if the display unit 40 includes an OLED, the first power, e.g., ELVDD, may be supplied to a transistor included in a pixel, and the second power, e.g., ELVSS, may be supplied to a cathode electrode. However, example embodiments are not limited thereto.

The first and second metal layers 201 and 202 may be formed of at least one metal, e.g., at least one of Al, Fe, Cu, Mo, Ag, W, and Ti. However, the current embodiment is not limited thereto, e.g., the first and second metal layers 201 and 202 may be formed of at least one of stainless steel, invar, and Mg. For example, the first and second metal layers 201 and 202 may be formed of Cu having high electrical conductivity, so the metal sealing substrate 200 may have minimized current and resistance drop when a power is transmitted from the power supply device 300 to the display unit 40. The first and second metal layers 201 and 202 may be formed of a same metal material or of different metal materials.

The first and second metal layers 201 and 202 may have a thickness of a few micrometers to a few tens of micrometers. For example, the first and second metal layers 201 and 202 may be continuous layers completely overlapping each other. For example, the first and second metal layers 201 and 202 may be connected to different parts of the display unit 40 to transmit different voltages thereto.

The insulating layer 210 may be interposed between the first and second metal layers 201 and 202 to insulate them from each other. If the insulating layer 210 is omitted, a short circuit may occur between the first and second metal layers 201 and 202 to which different voltages are supplied. The insulating layer 210 may have an area greater than that of the first or second metal layers 201 or 202.

The insulating layer 210 may be formed in a film type having a thickness in a range from a few micrometers to a few tens of micrometers. For example, as illustrate in FIG. 2, the insulating layer 210 may be thinner than each of the first and second metal layers 201 and 202. However, the current embodiment is not limited thereto, e.g., the insulating layer 210 may be thicker than the first and second metal layers 201 and 202. The insulating layer 210 may be formed of an insulating organic material, e.g., polyimide, polyester, and/or acryl, or an insulating inorganic material, e.g., silicon oxide, silicon nitride, and/or silicon oxynitride.

Referring to FIG. 2, a first adhesive layer 211 may be formed between the first metal layer 201 and the insulating layer 210, and a second adhesive layer 212 may be formed between the second metal layer 202 and the insulating layer 210. The first and second adhesive layers 211 and 212 may bond the respective first and second metal layers 201 and 202 to the insulating layer 210.

The first and second adhesive layers 211 and 212 may have a thickness in a range from a few micrometers to a few tens of micrometers, e.g., each of the first and second adhesive layers 211 and 212 nay have a same thickness as the insulating layer 210. For example, the first and second adhesive layers 211 and 212 may include at least an epoxy adhesive, a silicon adhesive, and/or an acryl adhesive. The first and second adhesive layers 211 and 212 may include the same material as the sealing member 50.

Since the sealing substrate 200 is made of metal, its thickness may be very small, e.g., may be manufactured to have a thickness on a scale of a few micrometers. As such, an overall thickness of the flat panel device 1 may be reduced, e.g., as compared to a display device having a glass sealing substrate. Also, manufacturing costs may be reduced, since manufacturing of a metal sealing substrate 200 is less expensive than manufacturing of a glass sealing substrate. Further, unlike the glass-sealing substrate, the metal sealing substrate 200 may be applied to a large size flat panel display device 1, e.g., having a screen size of about 40 inches or more.

As illustrated in FIG. 1, the metal sealing substrate 200 may be longer than the substrate 100 along a first direction, e.g., along the x-axis, so an edge 200a of the metal sealing substrate 200 that protrudes beyond the substrate 100 along the first direction may be folded on an upper side of the metal sealing substrate 200. That is, the sealing substrate 200 may include a first portion A' on the substrate 100 and a second portion B' that is continuous with and thicker than the first portion A'. For example, when the edge 200a is folded to contact an upper surface of the sealing substrate 200, i.e., to contact the second metal layer 202, the second portion B' may be twice as thick as the first portion A'. Further, as the sealing substrate 200 is folded, an upper surface of the sealing substrate 200 in the first portion A' includes the second metal layer 202, and an upper surface of the sealing substrate 200 in the second portion B' includes the first metal layer 201. As such, an upper surface of the sealing substrate 200 may include portions of both the first and second metal layers 201 and 202. In other words, both the first and second metal layers 201 and 202 may be exposed, so the power supply device 300 may be disposed on both folded and unfolded portions of the metal sealing substrate 200, i.e., on both the first and second portions A' and B', to contact, e.g., directly contact, both the first and second metal layers 201 and 202.

In detail, as discussed previously, the first power transmitted, i.e., supplied, from the power supply device 300 may be supplied to the first metal layer 201 of the metal sealing substrate 200, and the second power transmitted from the power supply device 300 may be supplied to the second metal layer 202 of the metal sealing substrate 200. However, when a conventional sealing substrate covers a substrate, i.e., a sealing substrate without a folded portion, only one of the first and second metal layers is exposed. Therefore, according to example embodiments, as a portion of the sealing substrate 200 is folded, an opposite surface of the sealing substrate 200, i.e., a portion of a bottom surface that includes the first metal layer 201, may be exposed to the outside.

Referring to FIG. 3, the power supply device 300 may be fixed on the metal sealing substrate 200 by a magnetic force to supply power to the display unit 40 through the metal sealing substrate 200. The power supply device 300 may include a first power supply unit 310, a second power supply unit 320, and an insulating unit 330 between the first and second power supply units 310 and 320. However, example embodiments are not limited thereto, and various other configurations are possible. The power supply device 300 illustrated in FIG. 2 is just an example, and the first power supply unit 310 and the second power supply unit 320 may be separately formed.

As illustrated in FIG. 1, the first power supply unit 310 may be fixed on a region of the metal sealing substrate 200 where the first metal layer 201 is exposed, i.e., in the second portion B', to supply the first power to the first metal layer 201. The second power supply unit 320 may be fixed on a region of the metal sealing substrate 200 where the second metal layer 202 is exposed, i.e., in the first portion A', to supply the second power to the second metal layer 202.

Referring back to FIG. 3, the first power supply unit 310 may include a first fixing unit 312 and a first connection unit 311. The first fixing unit 312 may include a magnet. Thus, the first fixing unit 312 may be fixed on the first metal layer 201 via a magnetic force. The first power supply unit 310 may further include a first adhesive unit 313 having a double-sided tape on a lower surface of the first fixing unit 312 that contacts the first metal layer 201. The first connection unit 311 may, e.g., directly, contact the first metal layer 201 to transmit the first power to the first metal layer 201.

The second power supply unit 320 may include a second fixing unit 322 and a second connection unit 321. The second fixing unit 322 may include a magnet. Thus, the second fixing unit 322 may be fixed on the second metal layer 202 via a magnetic force. The second power supply unit 320 may further include a second adhesive unit 323 having a double-sided tape on a lower surface of the second fixing unit 322 that contacts the second metal layer 202. The second connection unit 321 may, e.g., directly, contact the second metal layer 202 to transmit the second power to the second metal layer 202.

The insulating unit 330 may be disposed between the first power supply unit 310 and the second power supply unit 320 to insulate them from each other. Therefore, the insulating unit 330 may prevent a short circuit from occurring between the first and second power supply units 310 and 320.

According to example embodiments, the power supply device 300 may include the first and second power supply units 310 and 320 respectively fixed on different portions of the metal sealing substrate 200, i.e., on respective first and second metal layers 201 and 202. As such, a complicated process, e.g., soldering, for fixing the power supply device 300 on the metal sealing substrate 200 may be simplified and/or eliminated.

Referring back to FIG. 1, the sealing member 50 may be disposed between the substrate 100 and the metal sealing substrate 200. The sealing member 50 may be formed of at least one of an epoxy adhesive, a silicon adhesive, and an acryl adhesive. The sealing member 50, as shown in FIG. 1, may be disposed on edges of the substrate 100 to surround outer areas of the display unit 40. However, example embodiments are not limited thereto, e.g., the sealing member 50 may be coated to cover a surface of the substrate 100 and the entire display unit 40 formed on the substrate 100.

Figure 4:
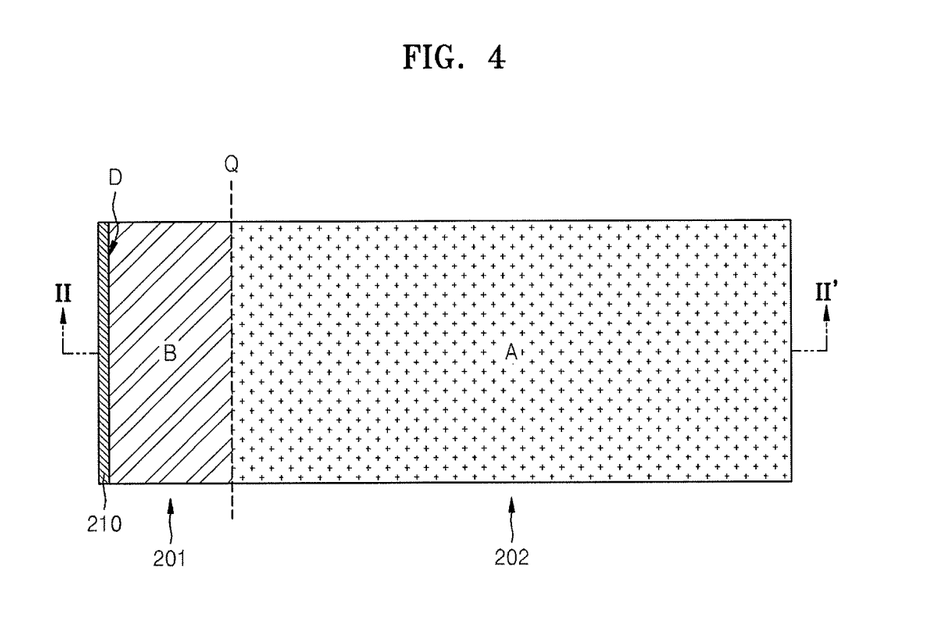
FIGS. 4 through 11 illustrate schematic cross-sectional views of stages in a method of manufacturing a flat panel display device according to an embodiment.

A method of manufacturing the flat panel display device 1 of FIG. 1 will now be described with reference to FIGS. 4 through 11. FIG. 4 illustrates a plan view of a stage in a process of manufacturing the flat panel display device 1, and FIG. 5 illustrates a cross-sectional view taken along line II-II' of FIG. 4.

Figure 5:
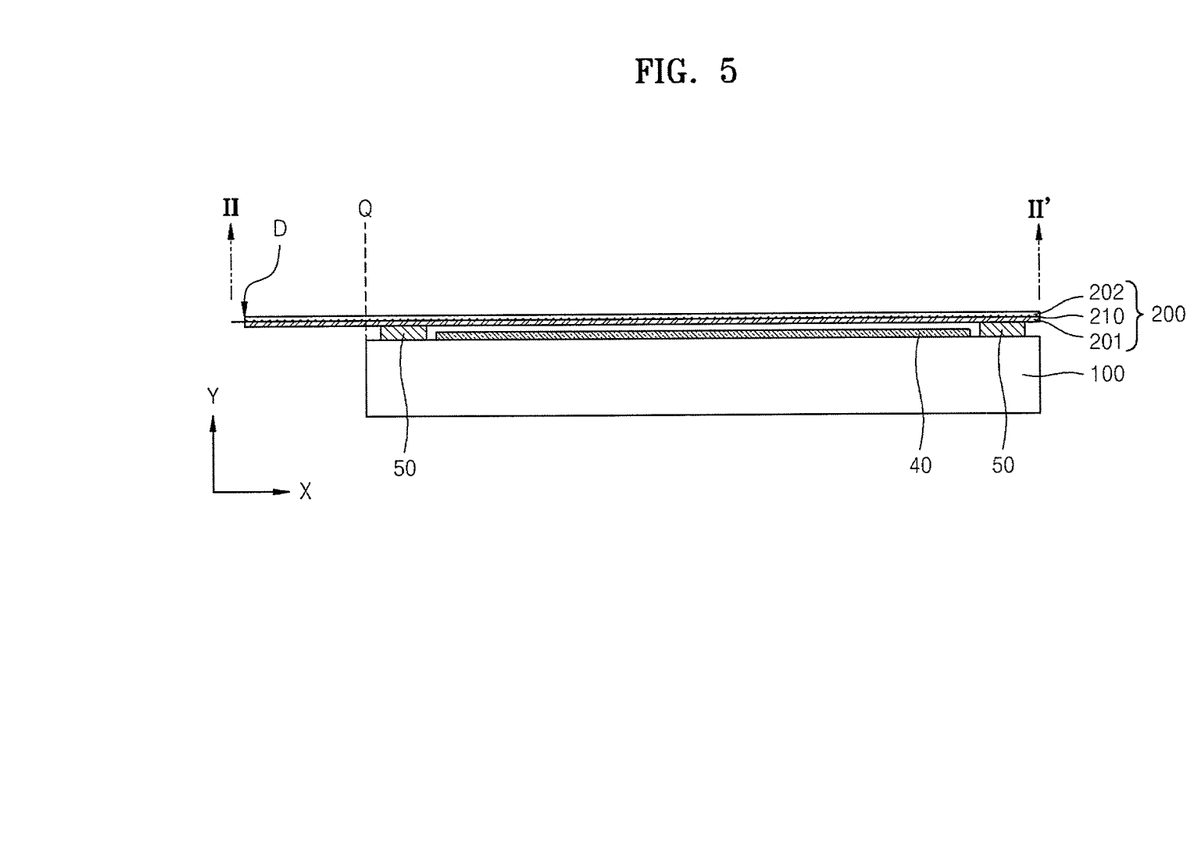

Referring to FIGS. 4 and 5, the substrate 100 having the display unit 40 on a surface of the substrate 100 may be provided. Next, the sealing member 50 may be disposed on the surface of the substrate 100, and the metal sealing substrate 200 may be disposed on the sealing member 50.

The metal sealing substrate 200 may include the first metal layer 201, the insulating layer 210, and the second metal layer 202 sequentially stacked from the substrate 100. As illustrated in FIG. 5, the metal sealing substrate 200 may have a larger area than that of the substrate 100. More specifically, an edge of the metal sealing substrate 200 may protrude beyond the substrate 100, i.e., the metal sealing substrate 200 may be longer than the substrate 100. For convenience of explanation, the metal sealing substrate 200 may be divided into a first portion A and a second portion B from a first boundary line Q. The position of the first boundary line Q on the metal sealing substrate 200 may be determined according to a length of a long-side of the substrate 100. The portion A is an area of the metal sealing substrate 200 that covers a portion of the surface of the substrate 100, i.e., the substrate 100 and first portion A completely overlap each other. The second portion B is an area of the metal sealing substrate 200 that is formed by protruding an edge of the metal sealing substrate 200 longer than the substrate 100, i.e., the second portion B extends beyond the substrate 100.

Meanwhile, an edge of the insulating layer 210 in the metal sealing substrate 200 may be longer than the first metal layer 201 or the second metal layer 202. In other words, as shown in FIGS. 4 and 5, an edge D of the insulating layer 210 may protrude beyond the first and second metal layers 201 and 202 in a direction extending from the portion A towards the second portion B. If the insulating layer 210 is formed to protrude, when the second portion B is folded to contact the first portion A, the edge D of insulating layer 210 contacts the first portion A, thereby preventing a short circuit between a first power source that flows in the first metal layer 201 of the second portion B and a second power source that flows in the second metal layer 202 of the first portion A.

Figure 6:
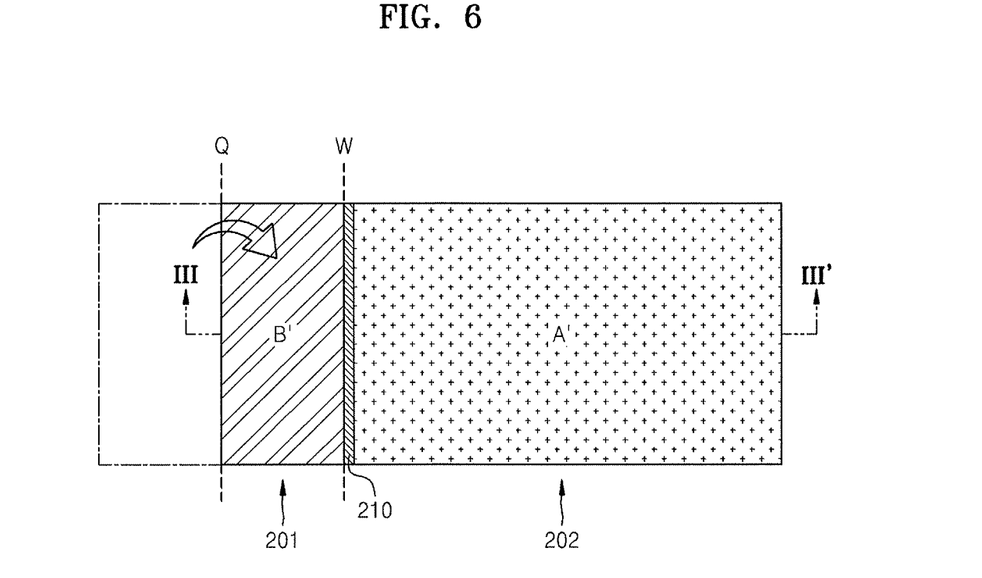
Figure 7:
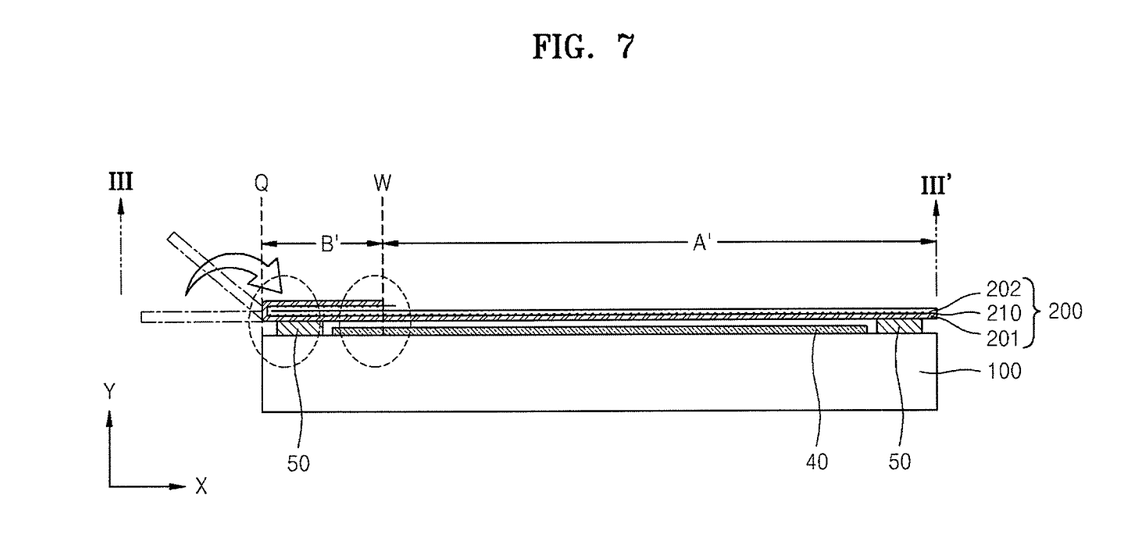

FIG. 6 illustrates a plan view of another stage in the process of manufacturing the flat panel display device 1 according to an embodiment. FIG. 7 illustrates a cross-sectional view taken along line of FIG. 6.

Referring to FIGS. 6 and 7, the second portion B of the metal sealing substrate 200 may be folded to overlap the first portion A. At this point, the second portion B is folded with respect to the first boundary line Q in a direction opposite to the substrate 100. The direction opposite to the substrate 100 denotes that the second portion B is folded away from the substrate 100 (see arrow in FIG. 7), i.e., the second portion B is folded toward the upper surface of the metal sealing substrate 200 so the second metal layer 202 in the second portion B contacts, e.g., directly, the second metal layer 202 in the first portion A.

As a result, the folded metal sealing substrate 200 may be divided into a second folded portion B' and a first remaining portion A' with a second boundary line W therebetween. The second folded portion B' denotes a region of the first portion A that overlaps the second portion B due to the folding of the second portion B, i.e., a region where the first metal layer 201 is exposed. The first remaining portion A' denotes a remaining region of the first portion A except the second folded portion B', i.e., a region where the second metal layer 202 is exposed.

Figure 8:
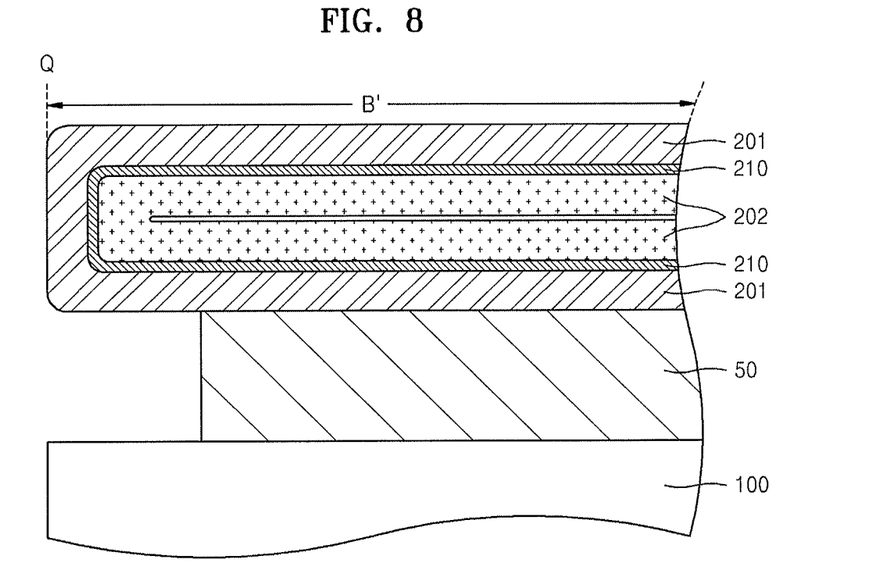

A structure in which the metal sealing substrate 200 is folded will now be described with reference to FIGS. 8 and 9. FIG. 8 illustrates an enlarged cross-sectional view of the second folded portion B'.

The metal sealing substrate 200 may have a structure in which the first metal layer 201, the insulating layer 210, and the second metal layer 202 are sequentially stacked from the substrate 100. Accordingly, the lowermost first metal layer 201 is exposed on an upper surface of the second folded portion B'.

Figure 9:
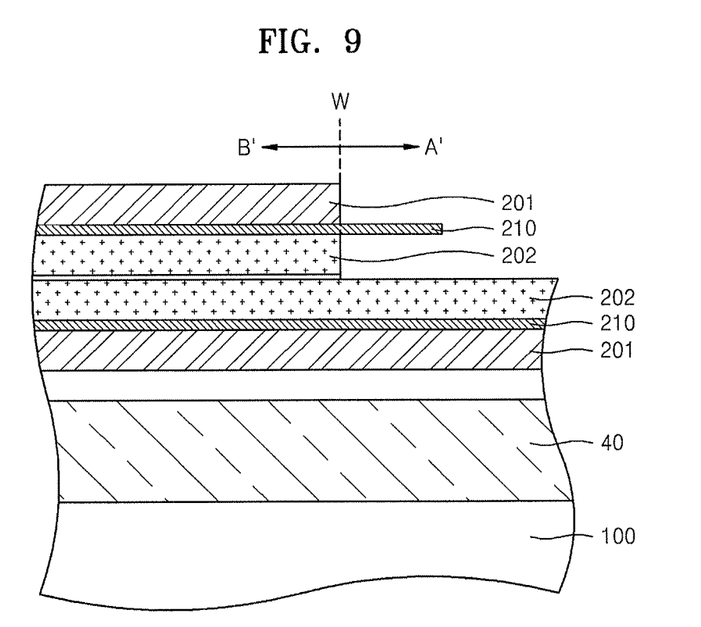

FIG. 9 illustrates a cross-sectional view of the second boundary line W between the second folded portion B' and the first remaining portion A'. In the first remaining portion A', the second metal layer 202 is exposed. That is, both the first and second metal layers 201 and 202 are exposed on an upper surface of the metal sealing substrate 200 on both sides of the second boundary line W. As described above, an edge of the insulating layer 210 may be longer than the first and second metal layers 201 and 202, thereby a short circuit between the first power source that flows in the first metal layer 201 and the second power source that flows in the second metal layer 202 may be prevented.

Figure 10:
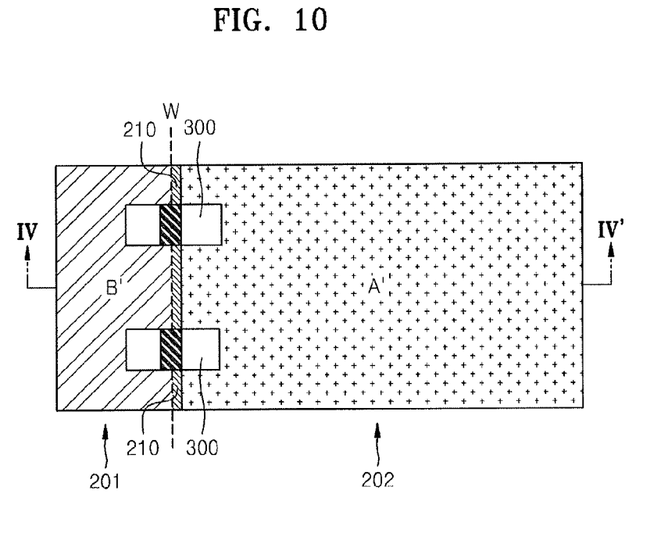
Figure 11:
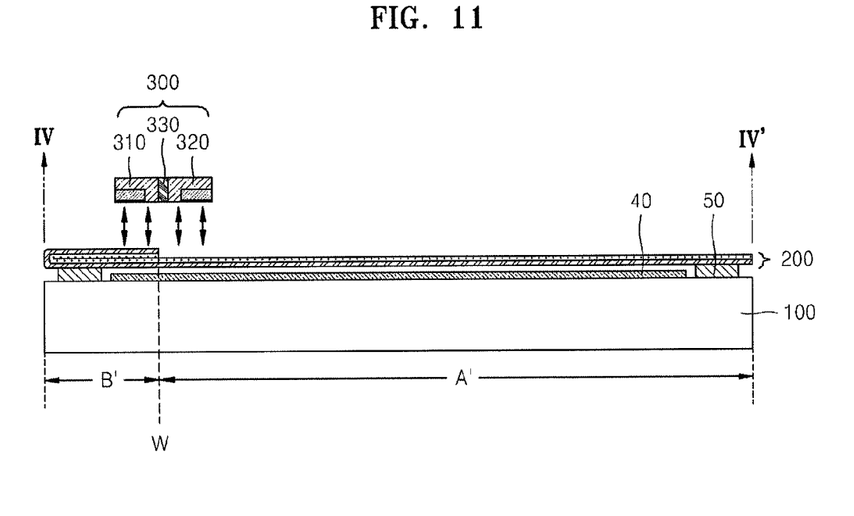

FIG. 10 illustrates a plan view of the flat panel display device 1 in a process of manufacturing thereof. FIG. 11 illustrates a cross-sectional view taken along line IV-IV' of FIG. 10.

Referring to FIGS. 10 and 11, the power supply device 300 that is fixed by a magnetic force may be disposed on the metal sealing substrate 200. When the power supply device 300 is disposed, the first power supply unit 310 may be disposed in the second folded portion B', and the second power supply unit may be disposed in the first remaining portion A'.

Since the first fixing unit 312 included in the first power supply unit 310 includes a magnet, the first fixing unit 312 is fixed in the second folded portion B' via a magnetic force. The first connection unit 311 supplies the first power to the first metal layer 201 by directly contacting the first metal layer 201 that is exposed in the second folded portion B'.

Since the second fixing unit 322 included in the second power supply unit 320 includes a magnet, the second fixing unit 322 is fixed on the first remaining portion A' via a magnetic force. The second connection unit 321 supplies the second power to the second metal layer 202 by directly contacting the second metal layer 202 exposed in the first remaining portion A'.

Also, the first fixing unit 312 and the second fixing unit 322 respectively include the first and second adhesive units 313 and 323. Thus, the first fixing unit 312 and the second fixing unit 322 may further be strongly fixed on the metal sealing substrate 200.

Example embodiments provide a flat panel display device that includes a metal sealing substrate and a power supply device that may be readily mounted on the metal sealing substrate and a method of manufacturing the same. Further, the power supply device 300 may be easily fixed on the metal sealing substrate 200 by a magnet included in the power supply device 300 without the need of performing a complicated process, e.g., soldering. Also, both the first and second metal layers 201 and 202 may be exposed by folding an edge of the metal sealing substrate 200. Therefore, a first power and a second power are simultaneously supplied to the display unit 40 by attaching a single power supply device 300 on an upper surface of the metal sealing substrate 200.

As the sealing substrate is formed of metal, the flat panel display device may be manufactured to have a large size at a competitive price. Further, since the power supply device is fixed on the metal sealing substrate via a magnetic force, a complicated process such as soldering is unnecessary. Also, a rate of product failure is lower than when the power supply device is fixed using an adhesive. In contrast, when a glass sealing substrate covers a substrate on which a display unit is formed, as the flat panel display devices becomes larger, the use of a glass material becomes uneconomical and causes process difficulties.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the example embodiments as set forth in the following claims.

What is claimed is:

1. A flat panel display device, comprising:
    a substrate having a display unit on a surface thereof;
    a metal sealing substrate on the substrate, the metal sealing substrate including a first metal layer, a second metal layer, and an insulating layer interposed between the first and second metal layers, the first metal layer, the insulating layer, and the second metal layer being sequentially stacked on the substrate;
    a sealing member between the substrate and the metal sealing substrate, the sealing member being configured to attach the substrate to the metal sealing substrate; and
    a power supply device including a magnet, the power supply being positioned on the metal sealing substrate and further including:
        a first power supply unit configured to supply a first power to the first metal layer of the metal sealing substrate,
        a second power supply unit configured to supply a second power to the second metal layer of the metal sealing substrate, and
        an insulating unit between the first power supply unit and the second power supply unit, the insulating unit being configured to insulate the first and second power supply units from each other.

2. The flat panel display device as claimed in claim 1, wherein each of the first and second metal layers includes at least one of Al, Fe, Cu, Mo, Ag, W, and Ti.

3. The flat panel display device as claimed in claim 1, wherein the insulating layer includes at least of polyimide, polyester, acryl, silicon oxide, silicon nitride, and siliconoxynitride.

4. The flat panel display device as claimed in claim 1, wherein the sealing member includes at least one of an epoxy group adhesive, a silicon group adhesive, and an acryl group adhesive.

5. The flat panel display device as claimed in claim 1, wherein the metal sealing substrate further comprises a first adhesive layer between the first metal layer and the insulating layer, and a second adhesive layer between the second metal layer and the insulating layer.

6. The flat panel display device as claimed in claim 5, wherein the first and second adhesive layers include a same material as the sealing member.

7. The flat panel display device as claimed in claim 1, wherein the metal sealing substrate has an area greater than that of the substrate.

8. The flat panel display device as claimed in claim 1, wherein the metal sealing substrate includes:
    a first portion covering a surface of the substrate; and
    a second portion continuous with the first portion and extending beyond the substrate, the second portion being folded to overlap the first portion at a boundary between the first and second portions.

9. The flat panel display device as claimed in claim 8, wherein the second portion is folded to the first portion in a direction opposite to the substrate.

10. The flat panel display device as claimed in claim 8, wherein the insulating layer protrudes beyond the second portion in a direction extending from the first portion toward the second portion.

11. The flat panel display device as claimed in claim 8, wherein the first power supply unit includes:
    a first fixing unit on the first portion of the metal sealing substrate, the first fixing unit including the magnet; and
    a first connection unit on the first fixing unit and directly contacting the first portion, the first connection unit being configured to supply the first power to the first metal layer.

12. The flat panel display device as claimed in claim 11, wherein the first fixing unit further comprises a first adhesive unit on a lower surface of the first fixing unit that contacts the first portion.

13. The flat panel display device as claimed in claim 12, wherein the first adhesive unit includes a double-sided tape.

14. The flat panel display device as claimed in claim 8, wherein the second power supply unit includes:
    a second fixing unit on the second portion of the metal sealing substrate, the second fixing unit including the magnet; and
    a second connection unit on the second fixing unit and directly contacting the second portion, the second connection unit being configured to supply the second power to the second metal layer.

15. The flat panel display device as claimed in claim 14, wherein the second fixing unit further comprises a second adhesive unit on a lower surface of the second fixing unit that contacts the second portion.

16. The flat panel display device as claimed in claim 15, wherein the second adhesive unit includes a double-sided tape.

17. A method of manufacturing a flat panel display device, the method comprising:
    a substrate having a display unit on a surface thereof;
    forming a metal sealing substrate on a substrate to seal a display unit, the metal sealing substrate including a first metal layer, a second metal layer, and an insulating layer interposed between the first and second metal layers, the first metal layer, the insulating layer, and the second metal layer being sequentially stacked on the substrate;
    forming a sealing member between the substrate and the metal sealing substrate, the sealing member being configured to attach the substrate to the metal sealing substrate; and
    forming a power supply device including a magnet, the power supply being positioned on the metal sealing substrate and further including:
        a first power supply unit configured to supply a first power to the first metal layer of the metal sealing substrate,
        a second power supply unit configured to supply a second power to the second metal layer of the metal sealing substrate, and
        an insulating unit between the first power supply unit and the second power supply unit, the insulating unit being configured to insulate the first and second power supply units from each other.

18. The method as claimed in claim 17, wherein forming the metal sealing substrate includes:

defining a first portion and a second portion, such that the first portion of the metal sealing substrate covers a surface of the substrate and the second portion of the metal sealing substrate protrudes beyond the substrate;

folding the second portion of the metal sealing substrate to overlap the first portion at a boundary between the first and second portions; and wherein forming the power supply device includes affixing the power supply to the metal sealing substrate via a magnetic force.

19. The method as claimed in claim 18, wherein folding the metal sealing substrate includes folding the second portion in a direction opposite to the substrate.

20. The method as claimed in claim 18, wherein forming the power supply device includes disposing the first power supply unit on the folded second portion and disposing the second power supply unit in the first portion.

* * * * *